(12) United States Patent
Jacke et al.

(10) Patent No.: US 8,450,860 B2
(45) Date of Patent: May 28, 2013

(54) POWER SWITCH COMPONENT HAVING IMPROVED TEMPERATURE DISTRIBUTION

(75) Inventors: Thomas Jacke, Tuebingen (DE); Christian Foerster, Reutlingen (DE); Timm Hoehr, Reutlingen (DE); Holger Heinisch, Reutlingen (DE); Christian Pluntke, Hechingen (DE); Joachim Joos, Emmering (DE)

(73) Assignee: Robert Bosch GmbH, Stuttgart (DE)

( * ) Notice: Subject to any disclaimer, the term of this patent is extended or adjusted under 35 U.S.C. 154(b) by 9 days.

(21) Appl. No.: 13/025,344

(22) Filed: Feb. 11, 2011

(65) Prior Publication Data

US 2011/0260341 A1  Oct. 27, 2011

(30) Foreign Application Priority Data

Apr. 21, 2010 (DE) .................. 10 2010 028 045

(51) Int. Cl.
*H01L 23/48* (2006.01)
*H01L 23/52* (2006.01)
*H01L 29/40* (2006.01)

(52) U.S. Cl.
USPC ........................................................ 257/784

(58) Field of Classification Search
USPC ........................................................ 257/784
See application file for complete search history.

(56) References Cited

U.S. PATENT DOCUMENTS 6,638,808 B1 * 10/2003 Ochi .............................. 438/238

* cited by examiner

*Primary Examiner* — Jenny L Wagner
(74) *Attorney, Agent, or Firm* — Kenyon & Kenyon LLP

(57) ABSTRACT

A power switch component having a semiconductor switch and a contacting applied to a contact zone of the semiconductor switch is introduced. The contact zone has a semiconductor layer and a metal plating applied to the semiconductor layer. The semiconductor layer has at least one conducting region and at least one non-conducting region situated directly under the metal plating.

7 Claims, 3 Drawing Sheets

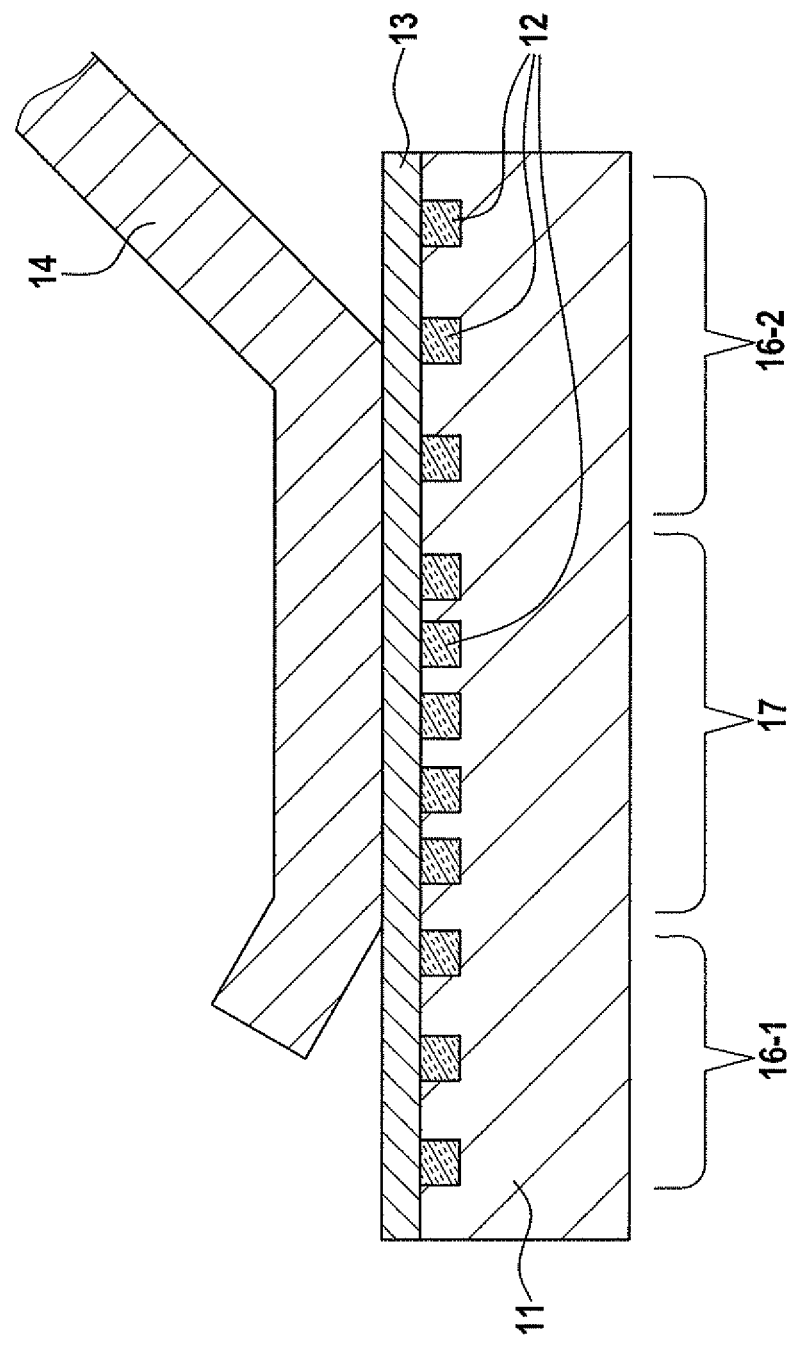

POWER SWITCH COMPONENT HAVING IMPROVED TEMPERATURE DISTRIBUTION

BACKGROUND INFORMATION

Power switch components for switching large currents are known in the related art. The declining power loss based on the flow of current through the power switch component was determined by the forward power losses of the semiconductor switch. In contrast, the most recent generations of power switch components such as, for example, trench MOSFETS, have forward power losses which may lie in the same range as the electrical losses of the contacting (for example, through bonding wires). This causes the contacting losses to be no longer negligible. From a thermal point of view, it is, however, more significant that the contacting and housing components that may possibly be used for current conduction no longer represent heat sinks but are instead heat sources. These heat sources may be a cause of interfering local temperature increases of the contacted semiconductor switch.

Another effect, which also results in an increased power loss in the area of the contacting zone, is transverse conduction losses within the metal plating layer of the semiconductor switch. In addition to the forward bias, in power switch components having structurally related inverse or body diodes there is also the possibility of a high heat input through the current-carrying contacting elements. In the automotive industry, battery polarity reversal is a typical example of non-homogeneous current distribution and accordingly heat distribution in negative polarity.

The above-mentioned effects may result in interfering local temperature increases of the semiconductor switch, which in turn limit the current-carrying capacity of the power switch component in at least some operating states. In practice, the result of these limitations is that larger switches are provided, which increases the cost of a system.

The corrective measures known in the related art typically start with the type of contacting, for example, using the so-called Cu clip or ribbon bond techniques. On the other hand, in integrated circuits (ICs), it is attempted to make better use of the thermal capacity of the semiconductor material. However, none of these techniques is capable of completely preventing local temperature increases.

SUMMARY OF THE INVENTION

According to the present invention, a power switch component having a semiconductor switch and a contacting applied to a contact zone (or contact pad) of the semiconductor switch is therefore introduced. The contact zone has a semiconductor layer and a metal plating applied to the semiconductor layer. The semiconductor layer has at least one conducting region and at least one non-conducting region situated directly under the metal plating.

The placement of one or a plurality of non-conducting regions directly under the metal plating of the contact zone makes it possible to influence the local distribution of the current flowing from the semiconductor layer into the metal plating or in the opposite direction because the current must search for paths around the non-conducting regions. This makes it possible to model a distribution of the heat generated by the flow of current. Although the provision of the at least one non-conducting region does not reduce the forward power losses compared to conventional power switch components, it is, however, possible to reduce maximum temperatures effectively, thus preventing a local overheating of the semiconductor material or of the contacting.

Preferably, the at least one non-conducting region is situated within the conducting region. The conducting region may thus be situated in an annular shape around a non-conducting region or enclose a plurality of non-conducting regions in a lattice structure.

The semiconductor switch is preferably designed as a MOSFET; however, the present invention may also be used on other types of semiconductor switches.

The metal plating of the contact zone is preferably a source metal plating of the semiconductor switch. That is where the greatest current densities and accordingly local temperature increases are to be expected, making it possible for the present invention to deploy its advantages in an optimal way.

The at least one non-conducting region may be designed as a MOS structure, a dielectric, or as an undoped or only partially doped semiconductor region. Seen to have an equivalent effect as an undoped semiconductor region, in one implementation of the semiconductor switch as a MOSFET, a doped region in which a corresponding region of the gate is designed to be non-conducting is such that no inversion occurs in the doped region despite an application of a suitable gate voltage.

The contacting is preferably designed as a bonding wire. Bonding wires may be damaged by excessive local temperature increases or may even separate from the contact zone, so that the present invention may be used to particular advantage in this area.

According to the present invention, it is possible in the presence of a plurality of non-conducting regions to increase the density of the non-conducting regions within the conducting region where particularly high currents are expected, and on the other hand to reduce it where lower currents are expected. For that reason, in a particularly preferred specific embodiment of the power switch according to the present invention, the semiconductor layer has a first area and a second area and has at least one non-conducting region in each of the first and second areas, a first area ratio of non-conducting regions to the at least one conducting region being higher than a second area ratio of non-conducting areas to the at least one conducting region in the second area on a contact surface of the semiconductor layer for the metal plating in the first area. This specific embodiment of the present invention allows a detailed modeling of a desired current profile over the contact zone, making an optimal distribution of the generated heat possible.

BRIEF DESCRIPTION OF THE DRAWINGS

FIG. 3 shows a vertical section through a portion of a third power switch component according to the present invention.

DETAILED DESCRIPTION

Figure 1:
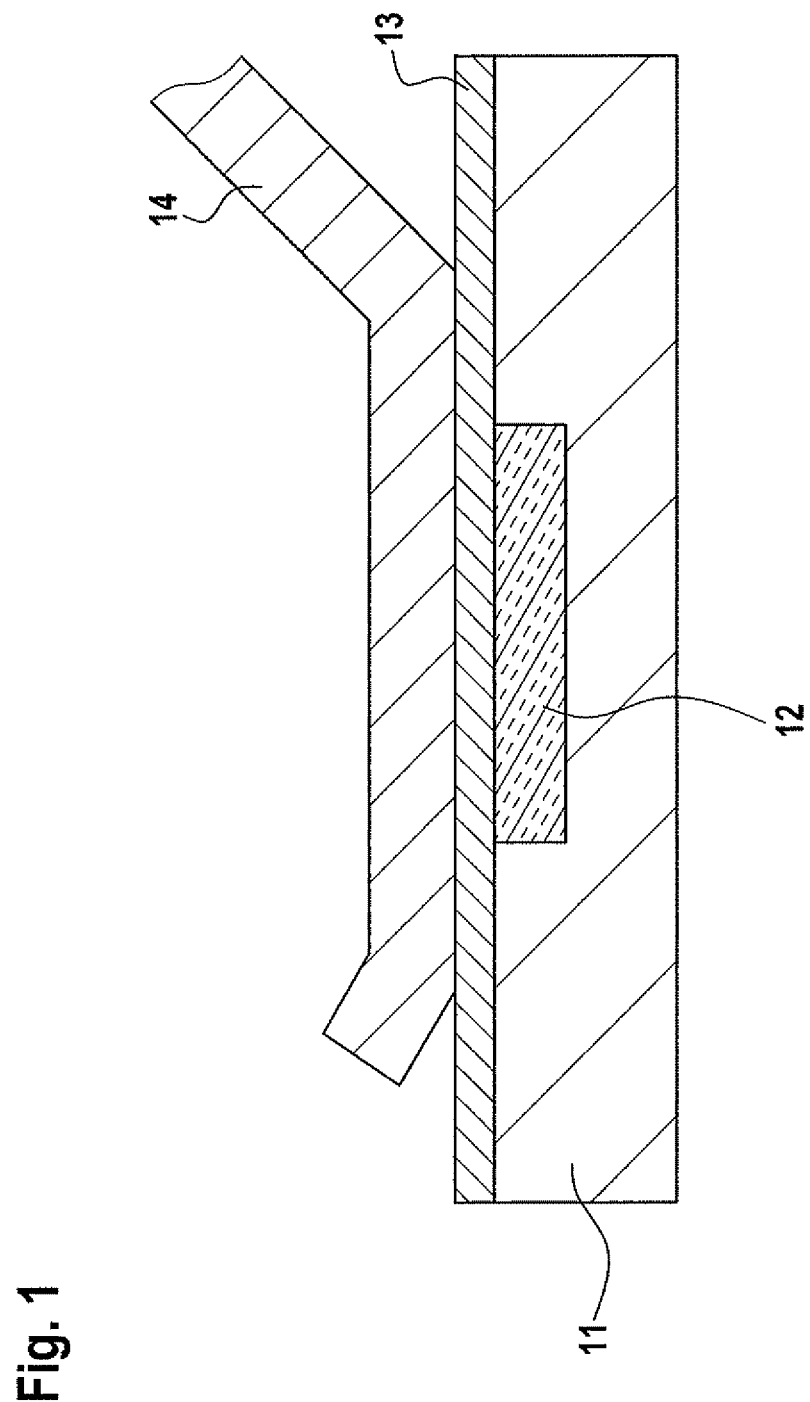
FIG. 1 shows a vertical section through a portion of a first power switch component according to the present invention.

FIG. 1 shows a vertical section through a portion of a first power switch component according to the present invention. A semiconductor switch shown in section has a contact zone which in the present case occupies an entire side of the semiconductor switch along the section. The contact zone has a metal plating 13, which is applied to a semiconductor layer which is subdivided into a conducting region 11 and non-conducting region 12 situated within conducting region 11. Non-conducting region 12 is situated directly under metal plating 13, i.e., metal plating 13 is not conductively contacted in the area of non-conducting region 12, preventing a flow of current into metal plating 13 in the area of non-conducting region 12. In the example shown, a bonding wire 14 is applied as contacting on metal plating 13. The present invention may, however, also be used advantageously with other types of contacting.

Due to non-conducting region 12 of the present invention, no current is able to flow into the metal plating in its area and accordingly into the contacting, forcing a different current distribution than would be the case without non-conducting region 12. This other current distribution lowers the current density and accordingly local temperature increases, resulting in a weakening of resulting thermal gradients.

Figure 2:
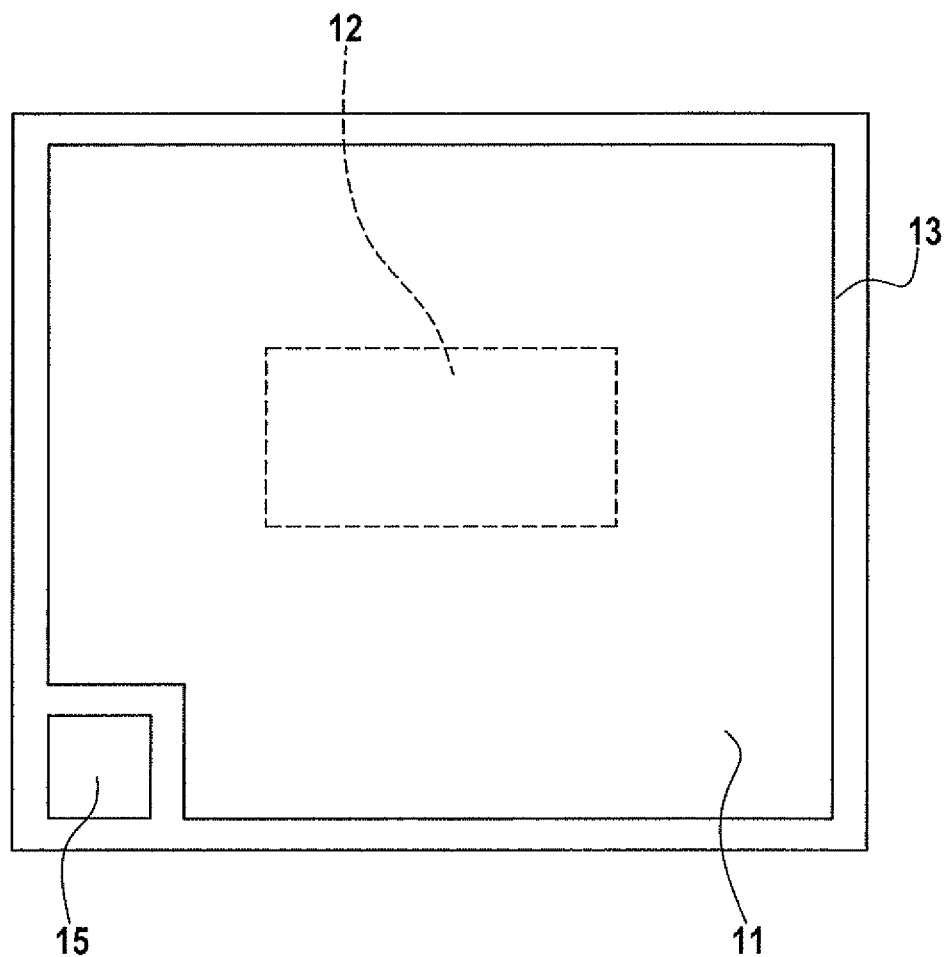
FIG. 2 shows a top view of a second power switch component according to the present invention.

FIG. 2 shows a top view of a second power switch component according to the present invention. In this case, metal plating 13 occupies almost the complete top of the power switch component which is, however, shown without contacting in the present case. Apart from metal plating 13, a control contact 15 is provided which is insulated from metal plating 13 and may be, for example, a gate terminal or a base terminal. A non-conducting region 12 lying under metal plating 13 is shown by dashed lines and is situated at least approximately in the center of metal plating 13. The other areas of metal plating 13 are applied on a conducting region 11. As already described, non-conducting region 12 displaces the flowing current into conducting region 11 and accordingly the heat generated into the other areas of metal plating 13 as well. The heat occurring is thus advantageously distributed to a larger area than would be the case without non-conducting region 12.

FIG. 3 shows a vertical section through a portion of a third power switch component according to the present invention. The third power switch component according to the present invention corresponds substantially to the first power switch component according to the present invention from FIG. 1. However, a large number of non-conducting regions 12 are provided which are situated distributed along a contact surface between metal plating 13 and the semiconductor layer. More non-conducting regions 12 are provided in a central area 17 than in a first and a second peripheral area 16-1 and 16-2. Since the ratio of non-conducting regions 12 to remaining conducting region 11 in area 17 is higher than in areas 16-1e and 16-2, the conductivity in region 17 is purposefully reduced. As a result, a high current occurring in area 17 as a function of the electrical characteristics in the overall assembly, which would result in a local temperature increase, is displaced into peripheral regions 16-1 and 16-2, which have a higher conductivity due to the lower proportion of non-conducting regions 12.

The example shown in FIG. 3 may be expanded to any geometric structures and may have any number of areas having a different density of non-conducting regions 12. It is also possible to adjust the dimensioning of individual non-conducting regions 12 in order to adjust the ratio of non-conducting and conducting regions in one area as desired. Of course, an area having a particularly low conductivity and accordingly a high density of non-conducting regions need not inevitably be situated in a central area of a contact zone.

In embodiments according to the present invention, a non-conducting region may also designate a region having lower conductivity than a conducting region different from zero.

What is claimed is:

1. A power switch component comprising:
a semiconductor switch; and
a contacting applied to a contact zone of the semiconductor switch,
wherein the contact zone has a semiconductor layer and a metal plating applied to the semiconductor layer, and
wherein the semiconductor layer has at least one conducting region and at least one non-conducting region situated directly under the metal plating, each of the at least one conducting region and the at least one non-conducting region directly contacting the metal plating in the contact zone.

2. The power switch component according to claim 1, wherein the at least one non-conducting region is situated within the conducting region.

3. The power switch component according to claim 1, wherein the semiconductor switch is a MOSFET.

4. The power switch component according to claim 3, wherein the metal plating of the contact zone is a source metal plating of the semiconductor switch.

5. The power switch component according to claim 1, wherein the at least one non-conducting region includes at least one of a MOS structure, a dielectric, an undoped semiconductor region, and an only partially doped semiconductor region.

6. The power switch component according to claim 1, wherein the contacting includes a bonding wire.

7. The power switch component according to claim 1, wherein the semiconductor layer has a first area and a second area and has at least one non-conducting region in each of the first and second areas, a first area ratio of non-conducting regions to the at least one conducting region in the first area being higher than a second area ratio of non-conducting regions to the at least one conducting region in the second area on a contact surface of the semiconductor layer for the metal plating in the first area.

* * * * *